United States Patent
Miyake et al.

(10) Patent No.: US 7,307,463 B2
(45) Date of Patent: Dec. 11, 2007

(54) SOURCE FOLLOWER, VOLTAGE FOLLOWER, AND SEMICONDUCTOR DEVICE

(75) Inventors: Hiroyuki Miyake, Kanagawa (JP); Yutaka Shionoiri, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 791 days.

(21) Appl. No.: 10/815,775

(22) Filed: Apr. 2, 2004

(65) Prior Publication Data

US 2004/0201412 A1    Oct. 14, 2004

(30) Foreign Application Priority Data

Apr. 9, 2003    (JP) .............................. 2003-104720

(51) Int. Cl.
*H03K 5/153*    (2006.01)
*G09G 3/36*    (2006.01)

(52) U.S. Cl. .................. 327/437; 327/390; 345/104; 345/94; 345/100; 326/88; 326/83

(58) Field of Classification Search ................ 327/390, 327/437; 345/104, 100, 94; 326/88, 83
See application file for complete search history.

(56) References Cited

U.S. PATENT DOCUMENTS

| | | | |
|---|---|---|---|
| 5,689,205 A | | 11/1997 | Hughes et al. |
| 5,694,061 A | * | 12/1997 | Morosawa et al. ......... 326/119 |
| 5,783,952 A | | 7/1998 | Kazazian |
| 5,841,310 A | * | 11/1998 | Kalthoff et al. ............. 327/337 |
| 6,313,819 B1 | | 11/2001 | Maekawa et al. |
| 6,445,371 B1 | | 9/2002 | Miyazawa et al. |
| 7,126,518 B2 | * | 10/2006 | Tsuchi ........................ 341/144 |
| 7,173,590 B2 | * | 2/2007 | Uchino et al. ................. 345/92 |

(Continued)

FOREIGN PATENT DOCUMENTS

JP    11-073165    3/1999

(Continued)

OTHER PUBLICATIONS

Y. Kida et al.; "LN-4: A 3.8 inch Half-VGA Transflective Color TFT-LCD with Completely Integrated 6-bit RGB Parallel Interface Drivers"; *EURODISPLAY 2002*; pp. 831-834; 2002, month unknown.

(Continued)

*Primary Examiner*—Vibol Tan
(74) *Attorney, Agent, or Firm*—Fish & Richardson P.C.

(57) ABSTRACT

A source follower in which any one of the following three modes is selected by a plurality of switching elements: a first mode in which a first potential is supplied to a gate of a transistor and an input potential is supplied to a first electrode of a capacitor respectively and a second electrode of the capacitor and a source of the transistor are connected, a second mode in which an input potential is supplied to the first electrode and the gate of the transistor and the second electrode floats, and a third mode in which the first electrode and the gate of the transistor are connected and a potential thereof floats and a second potential is supplied to the second electrode, a drain of the transistor is supplied with a third potential, and a potential of the source of the transistor is supplied to a subsequent circuit.

27 Claims, 9 Drawing Sheets

U.S. PATENT DOCUMENTS

2004/0201056 A1* 10/2004 Miyata et al. ............... 257/303
2005/0190139 A1* 9/2005 Fujiyoshi .................... 345/100

FOREIGN PATENT DOCUMENTS

| | | |
|---|---|---|
| JP | 2000-194327 | 7/2000 |
| JP | 2000-347159 | 12/2000 |
| JP | 2001-083924 | 3/2001 |

OTHER PUBLICATIONS

Joon-Chul Goh et al.; "A New Poly-Si TFT Pixel Circuit Scheme for an Active-Matrix Organic Light Emitting Diode Displays"; *Asia Display / IDW '01*; pp. 319-322; 2001, month unknown.

H. Sekine et al.; "Amplifier Compensation Method for a Poly-Si TFT LCLV with an Integrated Data-Driver"; *1997 SID*; pp. 45-48; 1997, month unknown.

* cited by examiner

V1=Vin
V2=Vpre-Vop

V1=Vin
V2=Vpre-Vop

V1=Vo+Vin-(Vpre-Vop)
V2=Vo
Vout=Vo+Vin-Vpre

SOURCE FOLLOWER, VOLTAGE FOLLOWER, AND SEMICONDUCTOR DEVICE

BACKGROUND OF THE INVENTION

1. Field of the Invention

The present invention relates to a source follower and a voltage follower, and more particularly to a semiconductor device having a source follower and a voltage follower formed by using a thin film transistor in a driver circuit.

2. Description of the Related Art

In an active matrix semiconductor display device, pixels having display elements are arranged in matrix in a pixel portion and each pixel is supplied with video signals for controlling the drive of the display elements through a plurality of signal lines provided in the pixel portion. These signal lines have load capacitance caused by display elements or other circuit elements in the pixel. Therefore, when the current is not supplied enough, the load capacitance is not charged rapidly and a video signal to be inputted to each pixel are largely delayed or do not rise nor fall sharply. In particular, a larger pixel portion in a display device tends to suffer from the aforementioned problem since load capacitance between the wirings are increased as wiring length is increased in accordance with the increased pixels.

In view of the aforementioned problem, such circuit as a source follower or a voltage follower for transforming an impedance are typically provided on the output side of a signal line driver circuit. The source follower in particular has a rather simple configuration that the drain of a transistor is fixed at a constant potential, the gate is used for input, and the source is connected to a constant current supply and used for output. By using these circuits, an area required for the signal line driver circuit does not have to be expanded much even when signal lines are increased in accordance with the increased resolution, therefore, they are used as a typical impedance transformer for a signal line driver circuit of a semiconductor display device. By providing an impedance transformer on the output side of the signal line driver circuit, current supply to the signal line can be increased and a delay or blunted rise and fall of a video signal can be avoided.

An active matrix semiconductor display device formed by using an inexpensive glass substrate can not easily be miniaturized since a periphery (frame area) of the pixel portion required for mounting occupies more area as the resolution becomes higher. Thus, a method for implementing an IC formed by using a single crystalline silicon wafer is considered to be nearing its mature phase, therefore, a technology for integrating a signal line driver circuit and a scan driver circuit on the same glass substrate as a pixel portion, that is referred to as System On Panel is now focused on.

A thin film transistor, however, has a large variation in characteristics as compared to a single crystalline MOS transistor. A variation in threshold voltage in particular is directly reflected to an output voltage of a source follower and a voltage follower. FIG. 9A shows a circuit diagram of a typical source follower. In the source follower shown in FIG. 9A, an input potential Vin is supplied to the gate (G) of a transistor 901 and a potential Vdd (Vdd>Gnd (potential of the ground)) is supplied to the drain (D) from a power supply. The source (S) is connected to a constant current supply 902 and the potential of the source corresponds to an output potential Vout.

The output potential Vout of the source follower having the aforementioned configuration can be obtained by the following formula shown in [Formula 1]. Note that Vgs corresponds to a voltage (gate voltage) that deducted the potential of the source from the potential of the gate.

$$Vout = Vin - Vgs \qquad \text{[Formula 1]}$$

The potential of this gate voltage Vgs is dependent on the relation between the gate voltage Vgs and a drain current Id. In the case where the transistor 901 is operated in a saturation region, the drain current Id can be obtained by the following formula shown in [Formula 2]. Note that $\mu$ is mobility, $C_o$ is the gate capacitance per unit area, W/L is the proportion of the channel width W to the channel length L of a channel formation region, and Vth is a threshold voltage.

$$Id = \mu C_o W/L (Vgs - Vth)^2 / 2 \qquad \text{[Formula 2]}$$

In Formula 2, $\mu$, $C_o$, W/L, and Vth are all fixed values determined by each transistor. The drain current Id of the transistor 901 is approximately determined by the constant current supply 902. Therefore, when the threshold voltage Vth is constant, it is found from Formula 2 that a predetermined gate voltage Vgs can be obtained. In other words, the gate voltage Vgs varies when the threshold voltage varies, which ends in the variation in the output potential Vout.

FIG. 9B shows measured values of the output potential Vout relatively to the input potential Vin of the source follower shown in FIG. 9A. As shown in FIG. 9B, the output potential Vout has a variation according to each source follower. This variation in the output of the source follower provided on the output side of the signal line driver circuit cause a variation in the potential of the video signal of each line, and visibly appear as a luminance variation in stripe shapes.

SUMMARY OF THE INVENTION

In view of the aforementioned problem, the invention provides a source follower or a voltage follower which can avoid the variation in output potential even when the threshold voltages of TFTs vary, and a semiconductor device which can avoid the visible luminance variation in striped shapes due to the variation in output potential of the source follower or the voltage follower.

According to the invention, variation in the output potential due to the variation in gate voltage is corrected by using a capacitor. Specifically, an input potential Vin is supplied to a first electrode of a capacitor in a first period (write period). The source of a transistor is connected to a second electrode of the capacitor. A potential of the drain is fixed and a precharge potential Vpre is supplied to the gate, thus a potential that deducted the gate voltage Vgs from the precharge potential Vpre is supplied to the second electrode. At this time, the capacitor stores a voltage of Vin−Vpre+Vgs.

In a second period (store period), the first electrode of the capacitor and the gate electrode of the transistor are connected and an input potential Vin is supplied to both of them. By floating a potential of the second electrode of the capacitor, the voltage accumulated in the first period is stored. Subsequently, a potential of the first electrode of the capacitor and the gate of the transistor connected to each other floats in a third period (output period). Further, by supplying an offset potential Vo to the second electrode of the capacitor, the potential of the first electrode of the capacitor and the gate of the transistor becomes Vo+Vin−Vpre+Vgs, following the law of conservation of electric charge. Accordingly, a potential of the source of the transistor becomes Vo+Vin−Vpre, which corresponds to the output potential Vout. Thus, the output potential Vout can be determined independently of the potential of Vgs.

According to the aforementioned configuration of the invention, variation in the output potential of the source follower due to the variation in threshold voltage of the transistors can be avoided.

The idea of the invention can be applied to not only a source follower but a voltage follower using an operational amplifier as well. In this case, an input potential Vin is supplied to a first electrode of a capacitor in a first period (write period). An output terminal of the operational amplifier is connected to a second electrode of the capacitor. By supplying a precharge potential Vpre to a non-inverted input terminal, a potential that deducted an offset voltage Vop of the operational amplifier from the precharge potential Vpre is supplied to the second electrode of the capacitor. At this time, a voltage stored in the capacitor is Vin−Vpre+Vop. The offset voltage Vop of the operational amplifier is dependent on the characteristics of the transistors configuring the operational amplifier.

In a second period (store period), the first electrode of the capacitor is connected to the non-inverted input terminal of the operational amplifier and an input potential Vin is supplied to both of them. By floating a potential of the second electrode of the capacitor, the voltage accumulated in the first period is stored. Subsequently, a potential of the first electrode of the capacitor and the non-inverted input terminal of the operational amplifier connected to each other floats in a third period (output period). Further, by supplying an offset potential Vo to the second electrode of the capacitor, the potential of the first electrode of the capacitor and the non-inverted input terminal of the operational amplifier becomes Vo+Vin−Vpre+Vop, following the law of conservation of electric charge. Accordingly, a potential of the output terminal of the operational amplifier becomes Vo+Vin−Vpre, which corresponds to the output potential Vout. Thus, the output potential Vout can be determined independently of the potential of Vop.

According to the aforementioned configuration of the invention, variation in the output potential of the voltage follower due to the variation in threshold voltage of the transistors configuring the operational amplifier can be avoided.

By providing the source follower or the voltage follower on the output side of a signal line driver circuit, a variation in potential of video signals to be inputted to each signal line can be avoided and a visible luminance variation that appears in striped shapes on a semiconductor display device can be avoided.

It should be noted that a semiconductor device of the invention includes a semiconductor display device including a liquid crystal display device, a light emitting device having a light emitting element represented by an organic light emitting element in each pixel, a DMD (Digital Micromirror Device), a PDP (Plasma Display Panel), an FED (Field Emission Display) and the like, and other semiconductor display devices having a circuit element formed by using a semiconductor film in a driver circuit. A semiconductor device of the invention is not limited to the aforementioned semiconductor display devices and a semiconductor integrated circuit having the source follower or the voltage follower of the invention is included as well.

It is possible to use a transistor other than a thin film transistor in the invention. The transistor used in the invention may be a transistor formed by using a single crystalline silicon, a transistor formed by using SOI, or a thin film transistor formed by using a polycrystalline silicon or an amorphous silicon. It may be a transistor formed by using an organic semiconductor or a transistor formed by using a carbon nanotube. A transistor provided in a pixel of a light emitting device of the invention may comprise a single-gate structure, a double-gate structure, or a multi-gate structure having more than two gate electrodes.

According to the aforementioned configuration of the invention, a variation in output potential of the voltage follower due to the variation in threshold voltages of the transistors configuring an operational amplifier can be avoided. By providing the source follower or the voltage follower on the output side of a signal line driver circuit, a variation in potential of video signals to be inputted to each signal line can be avoided and a visible luminance variation that appears in striped shapes on a semiconductor display device can be avoided.

DETAILED DESCRIPTION THE INVENTION

Although the present invention will be fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

EMBODIMENT MODE1

Figure 1A:
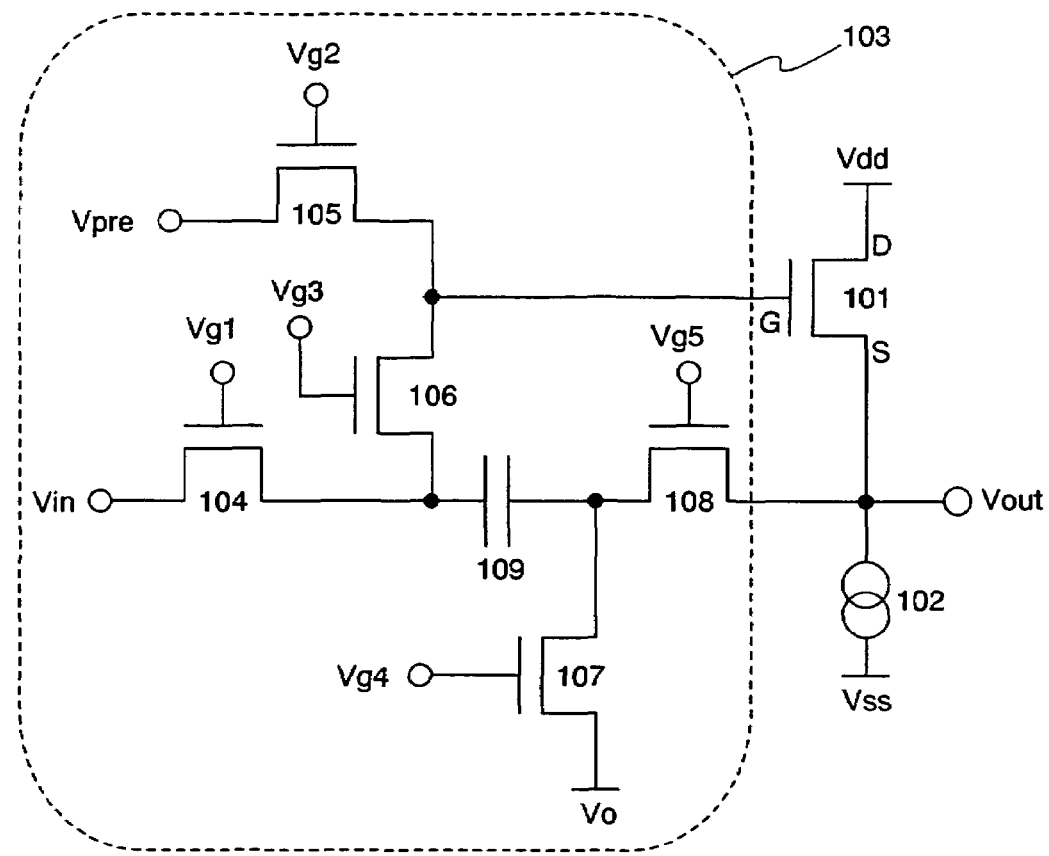
FIGS. 1A and 1B are a circuit diagram of the source follower of the invention and the timing chart thereof.

FIG. 1A is a circuit diagram which corresponds to one mode of the source follower of the invention. The source follower of the invention is configured with a transistor 101, a constant current supply 102, a correction unit 103 for correcting a potential supplied to the gate and the source of the transistor 101.

A fixed potential Vdd is supplied to the drain of the transistor 101 and the source thereof is connected to the constant current supply 102. The potential of the source of the transistor 101 corresponds to an output potential.

The correction unit 103 is configured with a capacitor 109, a plurality of transistors 104 to 108 as switching elements for controlling a voltage to be supplied to the capacitor 109. In FIG. 1A, specifically, the transistor 104 controls a supply of an input potential Vin to the first electrode of the capacitor 109. The transistor 107 controls a supply of an offset potential Vo to the second electrode of the capacitor 109. The transistor 108 controls a connection between the second electrode of the capacitor 109 and the source of the transistor 101. The transistor 105 controls a supply of a precharge potential Vpre to the gate of the transistor 101. The transistor 106 controls a connection between the gate of the transistor 101 and the first electrode of the capacitor 109. The transistor 105 and the transistor 106 control a supply of the precharge potential Vpre to the first electrode of the capacitor 109.

Hereinafter explained is an operation of the source follower shown in FIG. 1A. The operation of the source follower of the invention can be explained in three periods of a write period, a store period, and an output period. Potentials supplied to the gates of the transistors 104 to 108 are denoted as Vg1 to Vg5, respectively. A timing chart of the potentials Vg1 to Vg5 are shown in FIG. 1B.

Figure 1B:
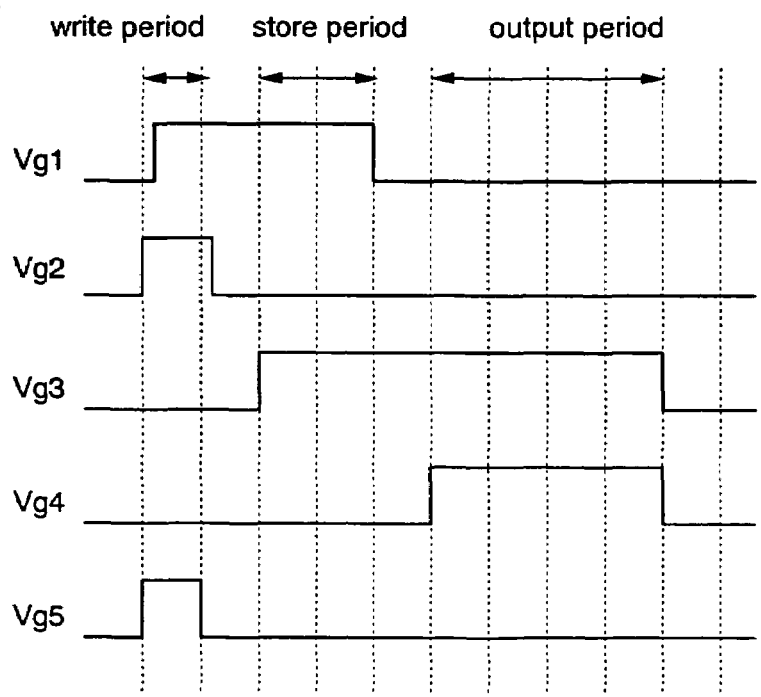
Figure 2A:
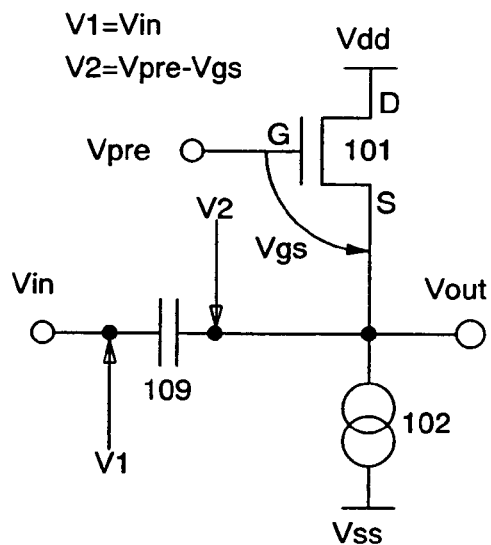
FIGS. 2A to 2C are the operations of the source follower of the invention shown in FIG. 1A.

As seen in the timing chart in FIG. 1B, the transistors 104, 105, and 108 are turned ON and the transistors 106 and 107 are turned OFF in the write period. A simplified connection between the transistor 101, the constant current supply 102, and the capacitor 109 in the source follower in FIG. 1A in the write period is shown in FIG. 2A. It should be noted that V1 denotes a potential of the first electrode, V2 denotes a potential of the second electrode of the capacitor 109. Vss denotes a fixed potential supplied from the power supply, which is lower than the potentials of Vdd, Vpre, and Vin, or it may be the same potential as a ground.

As shown in FIG. 2A, an input potential Vin is supplied to the first electrode of the capacitor 109 in the write period. Therefore, the potential V1 of the first electrode of the capacitor 109 becomes V1=Vin. Further, a potential for precharge (precharge potential) is supplied to the gate of the transistor 101 and the source thereof is connected to the second electrode of the capacitor 109. Therefore, the source of the transistor 101 has a potential that deducted a gate voltage Vgs from the precharge potential Vpre, which makes the potential V2 of the second electrode of the capacitor 109 as V2=Vpre−Vgs. Thus, a voltage Vc to be supplied to the capacitor 109 right before the termination of the write period is Vc=V1−V2=Vin−Vpre+Vgs.

At the beginning of the write period, the transistor 104 is preferably turned ON after turning ON the transistors 105 and 108. By operating the transistors at the aforementioned timing, an input potential Vin can be supplied to the first electrode of the capacitor 109 after the potential of the second electrode of the capacitor 109 is determined.

In the store period after the write period, the transistors 104 and 106 are turned ON and the transistors 105, 107, and 108 are turned OFF as shown in the timing chart in FIG. 1B. A simplified connection between the transistor 101, the constant current supply 102, and the capacitor 109 in the source follower in FIG. 1A in the store period is shown in FIG. 2B.

Figure 2B:
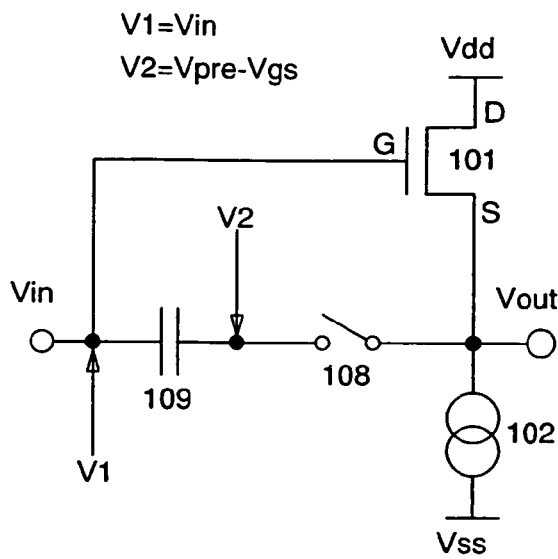

As shown in FIG. 2B, the first electrode of the capacitor 109 and the gate of the transistor 101 are connected in the store period. An input potential Vin is supplied to the first electrode of the capacitor 109 and the gate of the transistor 101. Therefore, a potential V1 of the first electrode is V1=Vin. The transistor 108 as a switching element is OFF, therefore, the potential of the second electrode of the capacitor 109 floats. Therefore, the potential V2 of the second electrode remains as V2=Vpre−Vgs as was in the write period. Thus, a voltage Vc to be supplied to the capacitor 109 right before the termination of the write period is stored unchanged as Vc=V1−V2=Vin−Vpre+Vgs.

It should be noted that the transistor 108 is preferably turned OFF at a faster timing than the transistor 105 when transiting from the write period to the store period. By operating the transistors at the aforementioned timing, a voltage supplied to the capacitor 109 can be stored without fail.

In the output period after the store period, the transistors 106 and 107 are turned ON and the transistors 104, 105, and 108 are turned OFF as shown in the timing chart in FIG. 1B. A simplified connection between the transistor 101, the constant current supply 102, and the capacitor 109 of the source follower in FIG. 1A in the output period is shown in FIG. 2C.

Figure 2C:
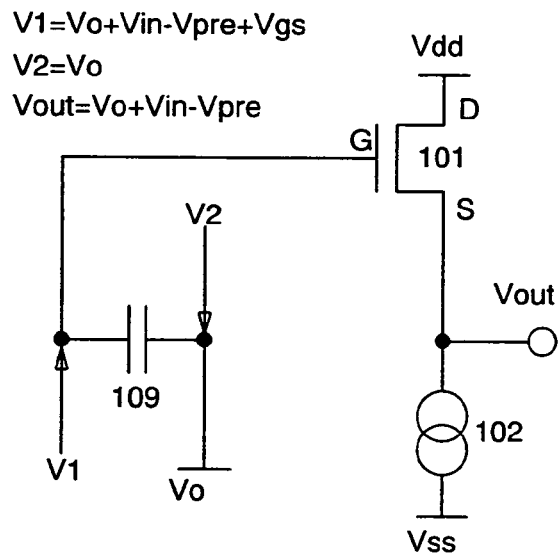

As shown in FIG. 2C, the first electrode of the capacitor 109 and the gate of the transistor 101 are connected in the output period. Unlike in the store period, an input potential Vin is not supplied to the first electrode of the capacitor 109 and the gate of the transistor 101, that is to say, the potential thereof floats. An offset potential Vo is supplied to the second electrode of the capacitor 109. Thus, the potential V2 of the second electrode of the capacitor 109 is V2=Vo. The voltage Vc stored in the capacitor 109 is stored as it is, following the law of conservation of electric charge. Therefore, the potential V1 of the first electrode of the capacitor 109 is V1=V2+Vc=Vo+Vin−Vpre+Vgs.

The gate of the transistor 101 is connected to the first electrode of the capacitor 109 and the source of the transistor 101 has a potential that deducted the gate voltage Vgs from the potential of the gate thereof. Therefore, the potential of the source of the transistor 101 is V1−Vgs=Vo+Vin−Vpre. This potential of the source of the transistor 101 corresponds to the output potential Vout of the source follower, which is obtained as Vout=Vo+Vin−Vpre.

Thus, the output potential Vout is determined by the offset potential Vo, the input potential Vin, and the precharge potential Vpre, regardless of the potential of the gate voltage Vgs of the transistor 101. Therefore, a variation in the output potential Vout of the source follower due to a variation in threshold voltage of the transistors can be avoided. By providing the source follower on the output side of a signal line driver circuit, a variation in potential of video signals to be inputted to each signal line can be avoided and a visible luminance variation that appears in striped shapes on a semiconductor display device can be avoided.

The offset potential Vo, the input potential Vin, and the precharge potential Vpre are set so that the transistor 101 operates in a saturation region. It is also important to set the offset potential Vo, the input potential Vin, and the precharge potential Vpre so that the constancy of the constant current supply can be maintained.

Before providing a write period again after the output period, a charge stored in the capacitor 109 may be reset. By resetting, the charge is to be a constant value at all times regardless of the amount of the charge accumulated in the write period.

The timing chart in FIG. 1B is based on the assumption that the transistors 104 to 108 shown in FIG. 1A are all n-channel transistors. The transistors 104 to 108 may be either n-channel or p-channel transistors. The potential to be supplied to the gate of each transistor is not limited to that shown in the timing chart in FIG. 1B. The timing chart is preferably changed according to the polarity of each transistor so that the transistors operate as shown in FIGS. 2A to 2C.

Note that the constant current supply may use a known configuration. For example, a single transistor or a plurality of transistors connected in series may be used as the constant current supply. In this case, the transistor used as the constant current supply is operated in a saturation region in order to maintain the constancy.

EMBODIMENT MODE 2

Figure 3A:
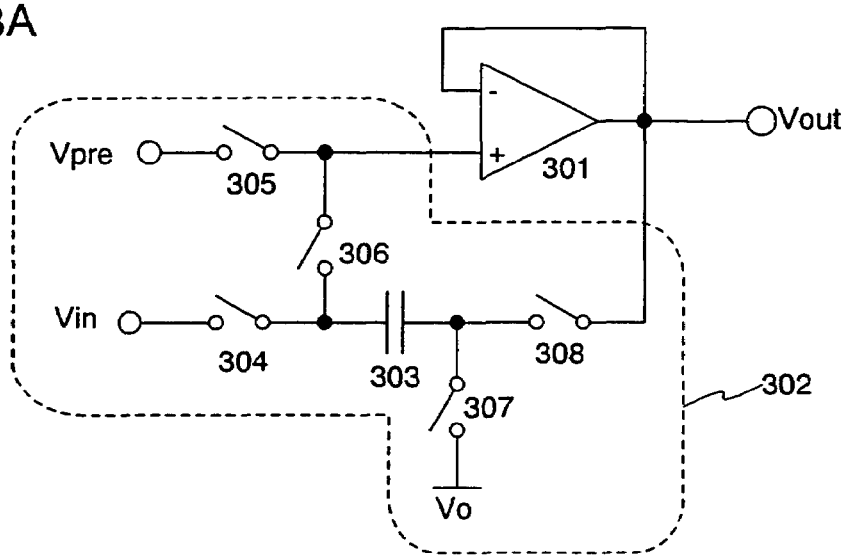
FIGS. 3A to 3D are the voltage follower of the invention and the operations thereof.

FIG. 3A is a circuit diagram which corresponds to one mode of the voltage follower of the invention. The voltage follower of the invention is configured with an operational amplifier 301 and a correction unit 302 for correcting a potential to be supplied to a non-inverted input terminal (+) and the output terminal of the operational amplifier 301. The inverted input terminal (−) of the operational amplifier 301 is connected to its output terminal. The potential of the output terminal of the operational amplifier 301 corresponds to an output potential.

The correction unit 302 is configured with a capacitor 303, a plurality of transistors 304 to 308 as switching elements for controlling a voltage to be supplied to the capacitor 303, as in the case of the source follower. In FIG. 3A, specifically, the transistor 304 controls a supply of an input potential Vin to the first electrode of the capacitor 303. The transistor 307 controls a supply of an offset potential Vo to the second electrode of the capacitor 303. The transistor 308 controls a connection between the second electrode of the capacitor 303 and the output terminal of the operational amplifier 301. The transistor 305 controls a supply of a precharge potential Vpre to the non-inverted input terminal of the operational amplifier 301. The transistor 306 controls a connection between the non-inverted input terminal of the operational amplifier 301 and the first electrode of the capacitor 303. The transistors 305 and 306 control a supply of the precharge potential Vpre to the first electrode of the capacitor 303.

Figure 3B:
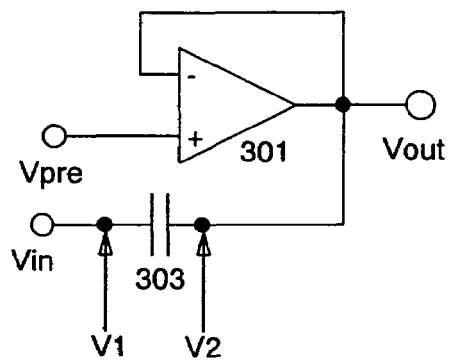

Hereinafter explained is an operation of the voltage follower shown in FIG. 3A. The operation of the voltage follower of the invention can be explained in three periods of a write period, a store period, and an output period as in the case of the source follower described in Embodiment Mode 1. The operations of the switching elements in each period are the same in the case of the source follower described in Embodiment Mode 1. That is to say, the transistors 304, 305, and 308 are turned ON and the transistors 306 and 307 are turned OFF in the write period. A simplified connection between the operational amplifier 301 and the capacitor 303 of the voltage follower in FIG. 3A in the write period is shown in FIG. 3B. It should be noted that V1 denotes a potential of the first electrode and V2 denotes a potential of the second electrode of the capacitor 303.

As shown in FIG. 3B, an input potential Vin is supplied to the first electrode of the capacitor 303 in the write period. Therefore, the potential V1 of the first electrode is V1=Vin. A potential for precharge (precharge potential) is supplied to the non-inverted input terminal of the operational amplifier 301 and the output terminal thereof is connected to the second electrode of the capacitor 303. Therefore, the output terminal of the operational amplifier 301 has a potential that deducted an offset voltage Vop of the operational amplifier 301 from the precharge potential Vpre, and the potential V2 of the second electrode of the capacitor 303 becomes V2=Vpre−Vop. Thus, a voltage Vc to be supplied to the capacitor 303 right before the termination of the write period is Vc=V1−V2=Vin−Vpre+Vop.

At the beginning of the write period, the transistor 304 is preferably turned ON after turning ON the transistors 305 and 308. By operating the transistors at the aforementioned timing, an input potential Vin can be supplied to the first electrode of the capacitor 303 after the potential of the second electrode of the capacitor 303 is determined.

In the store period after the write period, the transistors 304 and 306 are turned ON and the transistors 305, 307, and 308 are turned OFF. A simplified connection between the operational amplifier 301 and the capacitor 303 of the voltage follower in FIG. 3A in the store period is shown in FIG. 3C.

Figure 3C:
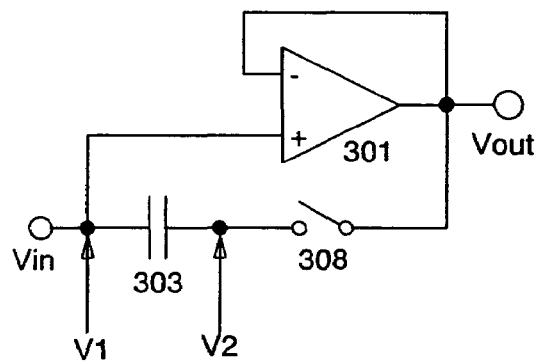

As shown in FIG. 3C, the first electrode of the capacitor 303 and the non-inverted input terminal of the operational amplifier 301 are connected in the store period. An input potential Vin is supplied to the first electrode of the capacitor 303 and the non-inverted input terminal of the operational amplifier 301. Therefore, the potential V1 of the first electrode of the capacitor 303 is V1=Vin. The transistor 308 as a switching element is OFF, therefore, the potential of the second electrode of the capacitor 303 floats. Therefore, the potential V2 of the second electrode of the capacitor 303 remains as V2=Vpre−Vop as was in the write period. Thus, a potential Vc to be supplied to the capacitor 303 right before the termination of the write period is stored unchanged as Vc=V1−V2=Vin−Vpre+Vop.

It should be noted that the transistor 308 is preferably turned OFF at a faster timing than the transistor 305 when transiting from the write period to the store period. By operating the transistors at the aforementioned timing, a voltage supplied to the capacitor 303 can be stored without fail.

In the output period after the store period, the transistors 306 and 307 are turned ON and the transistors 304, 305, and 308 are turned OFF. A simplified connection between the operational amplifier 301 and the capacitor 303 of the voltage follower in FIG. 3A in the output period is shown in FIG. 3D.

Figure 3D:
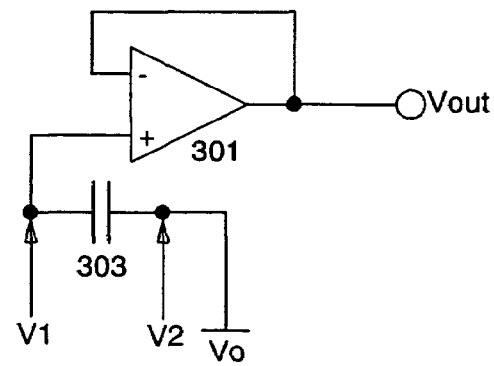

As shown in FIG. 3D, the first electrode of the capacitor 303 and the non-inverted input terminal of the operational amplifier 301 are connected in the output period. Unlike in the store period, an input potential Vin is not supplied to the first electrode of the capacitor 303 and the non-inverted input terminal of the operational amplifier 301, that is to say, the potential thereof floats. An offset potential Vo is supplied to the second electrode of the capacitor 303. Thus, the potential V2 of the second electrode of the capacitor 303 is V2=Vo. The voltage Vc stored in the capacitor 303 is stored as it is, following the law of conservation of electric charge. Therefore, the potential V1 of the first electrode of the capacitor 303 is V1=V2+Vc=Vo+Vin−Vpre+Vop.

The non-inverted input terminal of the operational amplifier 301 is connected to the first electrode of the capacitor 303 and the output terminal of the operational amplifier 301 has a potential that deducted the offset voltage Vop of the operational amplifier 301 from the potential of the non-inverted input terminal thereof. Therefore, the potential of the output terminal of the operational amplifier 301 is V1−Vop=Vo+Vin−Vpre. This potential of the output terminal of the operational amplifier 301 corresponds to the output potential Vout of the voltage follower, which is obtained as Vout=Vo+Vin−Vpre.

Thus, the output potential Vout is determined by the offset potential Vo, the input potential Vin, and the precharge potential Vpre, independently of the potential of the offset voltage Vop of the operational amplifier 301. Therefore, a variation in the output potential Vout of the voltage follower due to a variation in threshold voltage of the transistor can be avoided. By providing the voltage follower on the output side of a signal line driver circuit, a variation in potential of video signals to be inputted to each signal line can be avoided and a visible luminance variation that appears in striped shapes on a semiconductor display device can be avoided.

It is important to set the offset potential Vo, the input potential Vin, and the precharge potential Vpre so that the operational amplifier 301 operates properly.

Before providing a write period again after the output period, a charge stored in the capacitor 303 may be reset. By resetting, the charge is to be a constant value at all times regardless of the amount of the charge accumulated in the write period.

EMBODIMENT 1

Figure 4A:
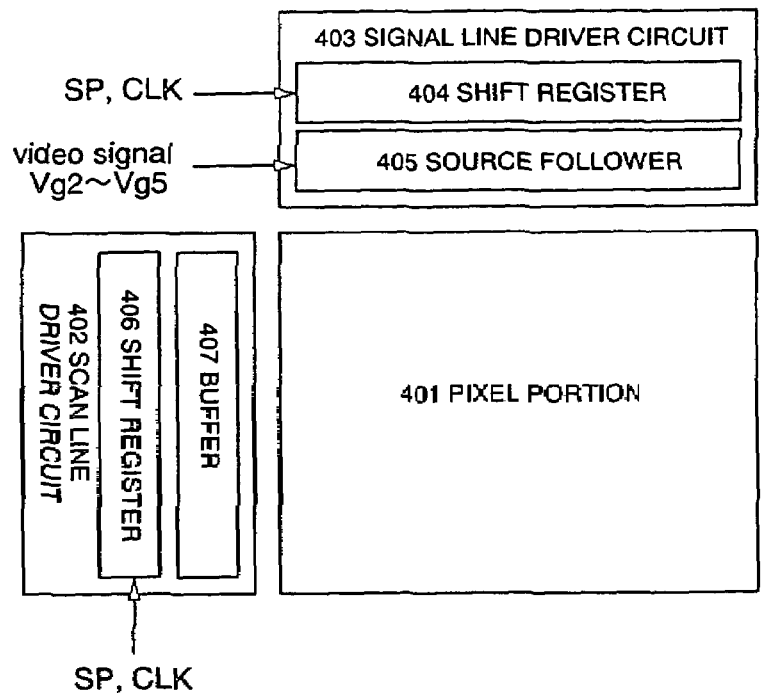
FIGS. 4A and 4B are block diagrams of the semiconductor display device using the source follower of the invention.

In this embodiment, a configuration of a semiconductor display device of the invention having the source follower of FIG. 1 in a driver circuit is described. FIG. 4A is a block diagram of the semiconductor display device of this embodiment. The semiconductor display device shown in FIG. 4A is configured with a pixel portion 401 having a plurality of pixels provided with display elements, a scan line driver circuit 402 for selecting each of the pixels, and a signal line driver circuit for controlling an input of a video signal to the selected pixel.

The signal line driver circuit 403 in FIG. 4A comprises a shift register 404 and a source follower 405. It should be noted that the source follower of the invention is used as an impedance transformer of the signal line driver circuit 403, however, the voltage follower of the invention can be used instead.

A clock signal (CLK) and a start pulse (SP) are inputted to the shift register 404. When the clock signal (CLK) and the start pulse (SP) are inputted, a timing signal is generated in the shift register 404 and inputted to the source follower 405. Specifically, the timing signal is supplied to the transistor 104 of the source follower in FIG. 1A as a potential Vg1.

Potentials Vg2 to Vg5 to be supplied to the other transistors 105 to 108 and a video signal are supplied to the source follower 405. A potential of the video signal is supplied to the source follower 405 as an input potential Vin. Therefore, an output potential of the source follower 405 obtained by the inputted video signal is supplied to subsequent signal lines in synchronization with the timing signal or the potentials Vg2 to Vg5. The output potential may have difference from the input potential, however, the output potential includes image data of the video signals to be supplied to the source follower 405. Therefore, the output potential to be supplied to the signal lines is a video signal as well.

In the case of the semiconductor display device having the signal line driver circuit shown in FIG. 4A, the output period can be overlapped with a display period of the pixels and the write period and the store period can be provided during the horizontal flyback period or the vertical flyback period. However, the write period and the store period can be provided during the other period than the flyback periods as needed as long as they are not overlapped with a period for inputting the video signal to the pixels connected to the signal lines.

A configuration of the scan line driver circuit 402 is described now. The scan line driver circuit 402 is configured with a shift register 406 and a buffer 407. A level shifter may be included as the case might be. A select signal is generated in the scan line driver circuit 402 when the clock signal CLK and the start pulse SP are inputted to the shift register 406. The generated select signal is then buffer amplified in the buffer 407 and then supplied to a corresponding scan line. Gates of transistors in one row of pixels are connected to the scan line. As the transistors of one row of pixels have to be turned ON simultaneously, the buffer 407 is required to be capable of flowing a large current.

It should be noted that the other circuits such as a decoder circuit that can select signal lines may be used instead of the shift registers 404 and 406.

The signal line driver circuit for driving the semiconductor display device of the invention is not limited to the configuration described in this embodiment.

EMBODIMENT 2

Figure 4B:
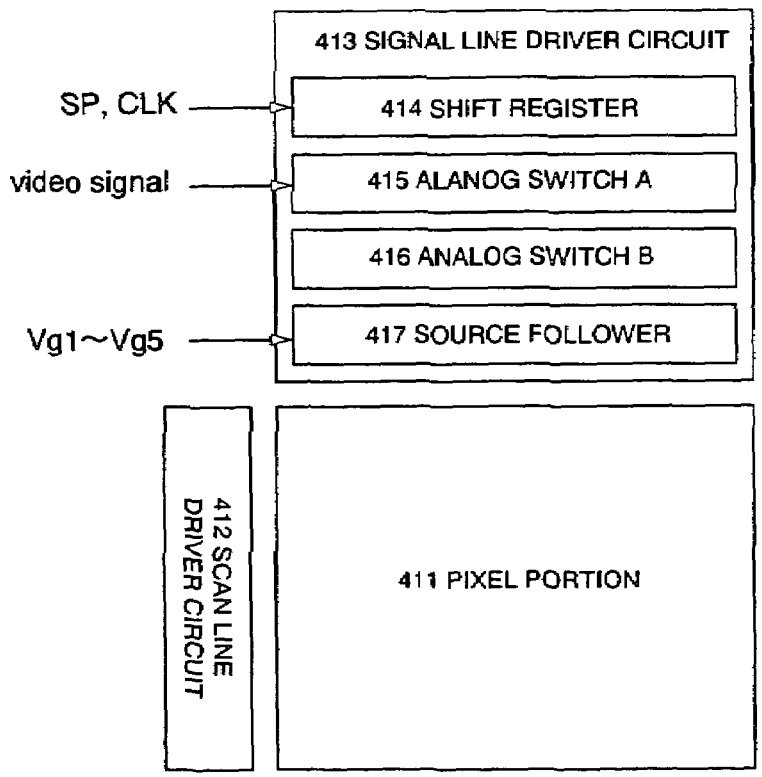

In this embodiment, a configuration of the semiconductor display device of the invention having the source follower of FIG. 1 in a driver circuit is described. FIG. 4B is a block diagram of the semiconductor display device of this embodiment. The semiconductor display device in FIG. 4B is configured with a pixel portion 411 having a plurality of pixels provided with display elements, a scan driver circuit 412 for selecting each of the pixels, and a signal line driver circuit 413 for controlling an input of a video signal to the selected pixel.

The signal line driver circuit 413 in FIG. 4B comprises a shift register 414, an analog latch A415, an analog latch B416, and a source follower 417. It should be noted that the source follower of the invention is used as an impedance transformer of the signal line driver circuit 413, however, the voltage follower of the invention can be used instead.

A clock signal (CLK) and a start pulse (SP) are inputted to the shift register 414. When the clock signal (CLK) and the start pulse (SP) are inputted, a timing signal is generated in the shift register 414 and inputted to a first stage of the analog latch A415 sequentially. When the timing signal is inputted to the analog latch A415, a video signal is inputted to the analog latch A415 sequentially in synchronization with the timing signal and stored therein. It should be noted that the video signal is inputted to the analog latch A415 sequentially in this embodiment, however, the invention is not limited to this configuration. The analog latch A415 constituted by a plurality of stages may be divided into some groups and the video signals may be inputted to each of the groups in parallel, that is referred to as a division (split) drive. Note that the number of division groups in the division driving is referred to as a division number. For example, in the case of dividing the latch into groups by four stages, it is referred to as a division drive in four.

A time required for inputting video signals into all the stages of latches in the analog latch A415 is referred to as a line period. In practice, the line period may include a horizontal flyback period in addition to the aforementioned line period.

After one line period is terminated, a latch signal is supplied to the analog latch B416 and the video signals stored in the analog latch A415 are supplied to the analog latch B416 in synchronization with the latch signals and stored therein. Subsequent video signals are inputted in synchronization with timing signals from the shift register 414 again to the analog latch A415 after supplying the video signals to the analog latch B416. In this second line period, the video signals supplied and stored in the analog latch B416 are inputted to the source follower 417 as an input potential Vin.

The potentials Vg1 to Vg5 supplied to the transistors 104 to 108 are supplied to the source follower 417. Therefore, an output potential of the source follower 417 obtained by the inputted video signal is supplied to subsequent signal lines in synchronization with the latch signals or the potentials Vg1 to Vg5.

Figure 5:
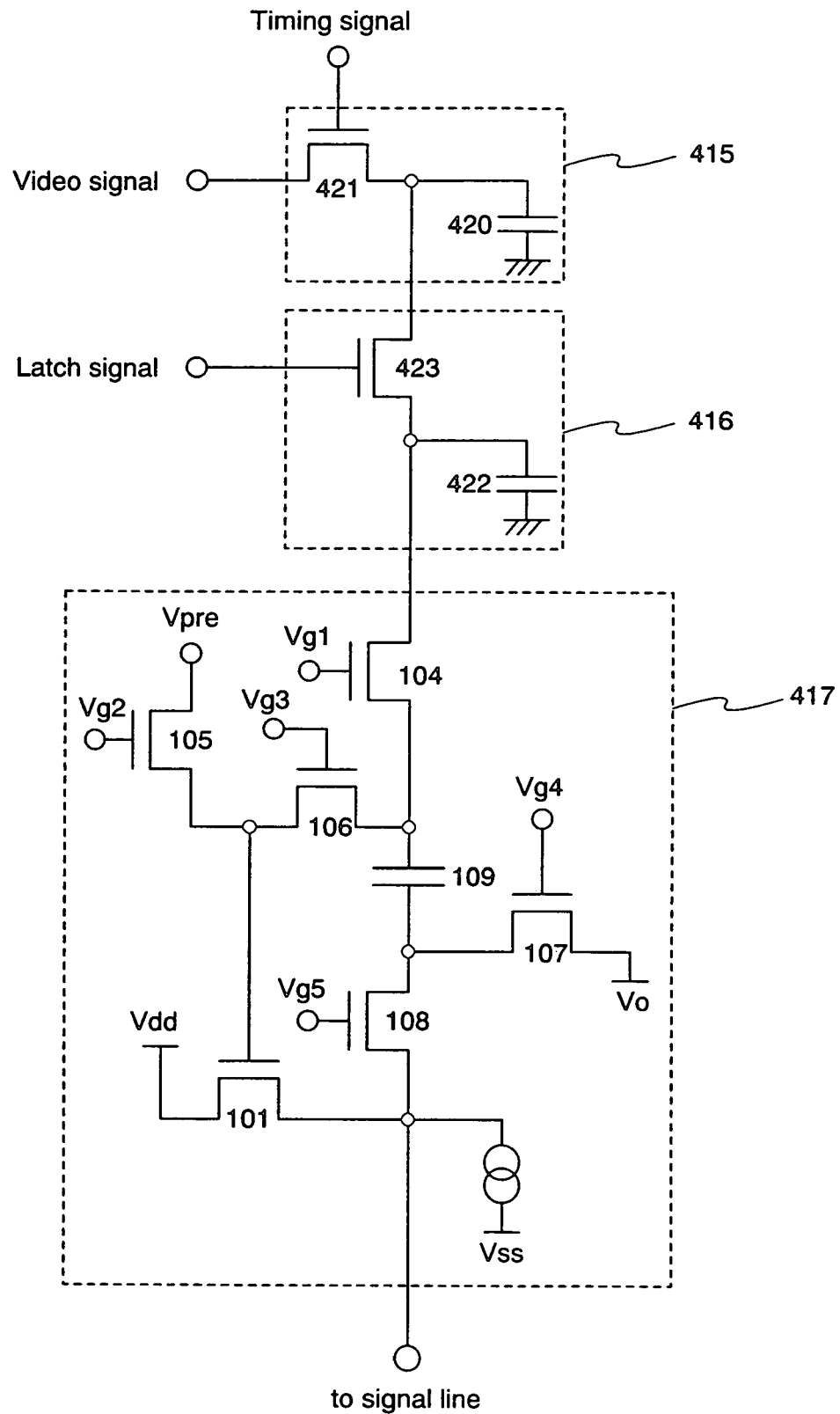
FIG. 5 is a circuit diagram of a part of the signal line driver circuit in FIG. 4B.

FIG. 5 is an example of a specific circuit diagram of the analog latch A415, the analog latch B416, and the source follower 417 in the signal line driver circuit 413. As shown in FIG. 5, the analog latch A415 is configured with a capacitor 420 and a switch 421 for controlling a potential supply of a video signal to the capacitor 420. Switching of the switch 421 is controlled by a timing signal. The analog latch B416 is configured with a capacitor 422 and a switch 423 for controlling the potential supply of the video signal stored in the capacitor 420 to the capacitor 422. Switching of the switch 423 is controlled by a latch signal.

The source follower 417 has the same configuration as the source follower in FIG. 1A, in which a potential of a video signal stored in the capacitor 422 is supplied to the source follower 417 as an input potential Vin. A switching element may be provided between the source follower 417 and signal lines so that an output potential which is supposed to be supplied in the output period is not supplied to the signal lines in the write period and the store period.

In the case of the semiconductor display device having the signal line driver circuit shown in FIGS. 4B and 5, the output period can be overlapped with a display period of the pixels and the write period and the store period can be provided during the horizontal flyback period or the vertical flyback period. However, the write period and the store period can be provided during the other period than the flyback periods as needed as long as they are not overlapped with a period for inputting the video signal to the pixels connected to the signal lines.

It should be noted that the other circuits such as a decoder circuit that can select signal lines may be used instead of the shift registers 414 and 416.

Figure 6:
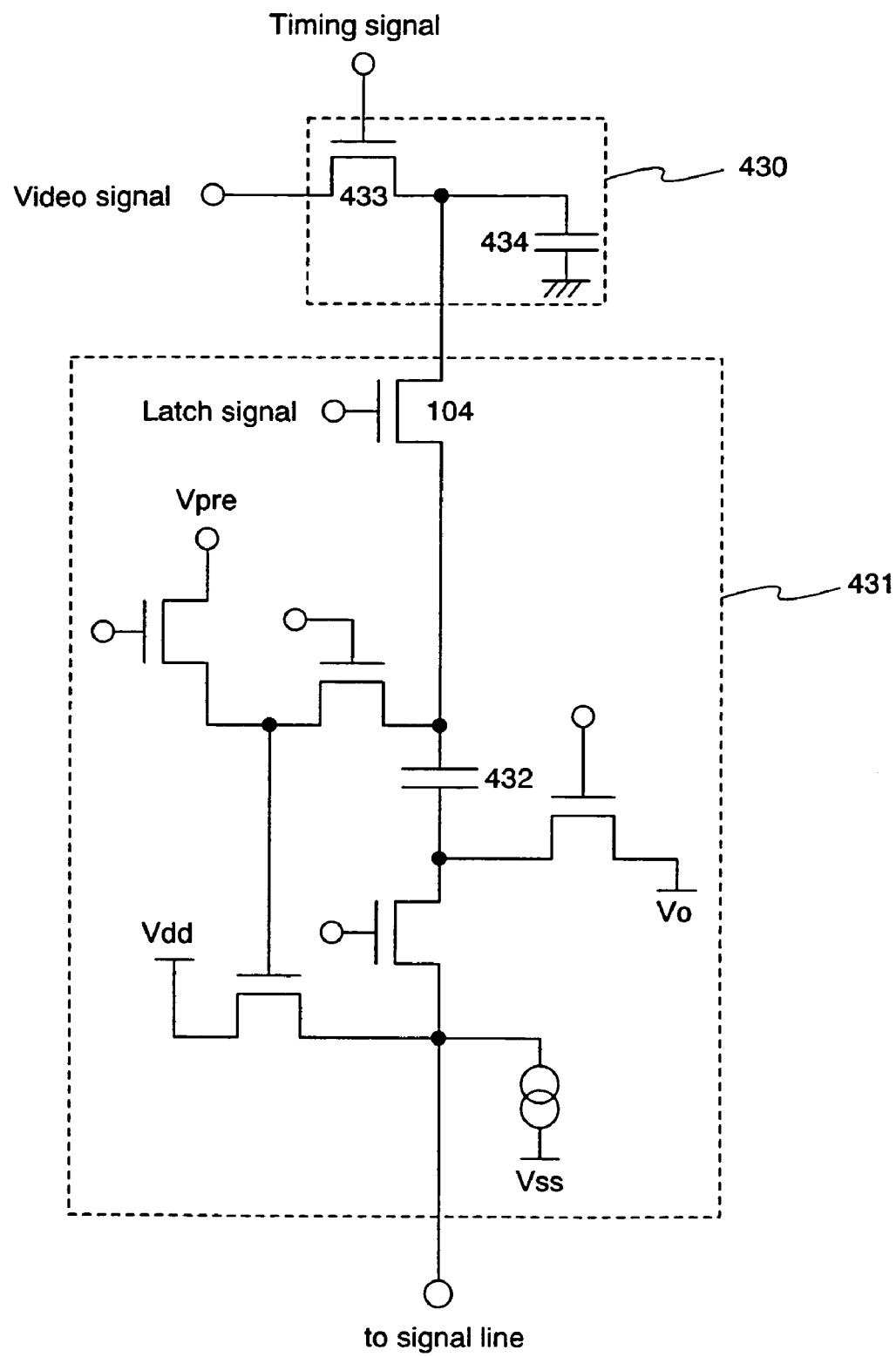
FIG. 6 is a circuit diagram of another mode of the signal line driver circuit.

The signal line driver circuit can be configured by using the capacitor 109 of the source follower 417 as a capacitor of the analog latch and omitting one of the two analog latches. FIG. 6 is an example in which a capacitor in the source follower is used as a capacitor of an analog latch in a part of the signal line driver circuit in FIG. 5.

FIG. 6 is a circuit diagram of an analog latch 430 and a source follower 431 provided in a signal line driver circuit. In the analog latch 430, when a switch 433 is turned ON by a timing signal supplied from a shift register, a potential of a video signal is supplied to a capacitor 434 and stored therein. A potential of a latch signal is then supplied to the source follower 431 as Vg1, which controls the switching of the transistor 104. When the transistor 104 is turned ON, the potential of the video signal stored in the capacitor 434 is supplied to the capacitor 432 in the source follower 431 and stored therein. By an output potential of the source follower 431 supplied to the signal lines, video signals are inputted to each of the pixels.

By using the capacitor of the source follower as the capacitor of the analog latch, the number of analog latches can be reduced drastically as compared to the signal line driver circuit in FIG. 5, thus the area occupied by the signal line driver circuit can be suppressed.

The signal line driver circuit for driving the semiconductor display device of the invention is not limited to the configurations shown in FIGS. 4A, 4B and 5.

EMBODIMENT 3

Figure 7:
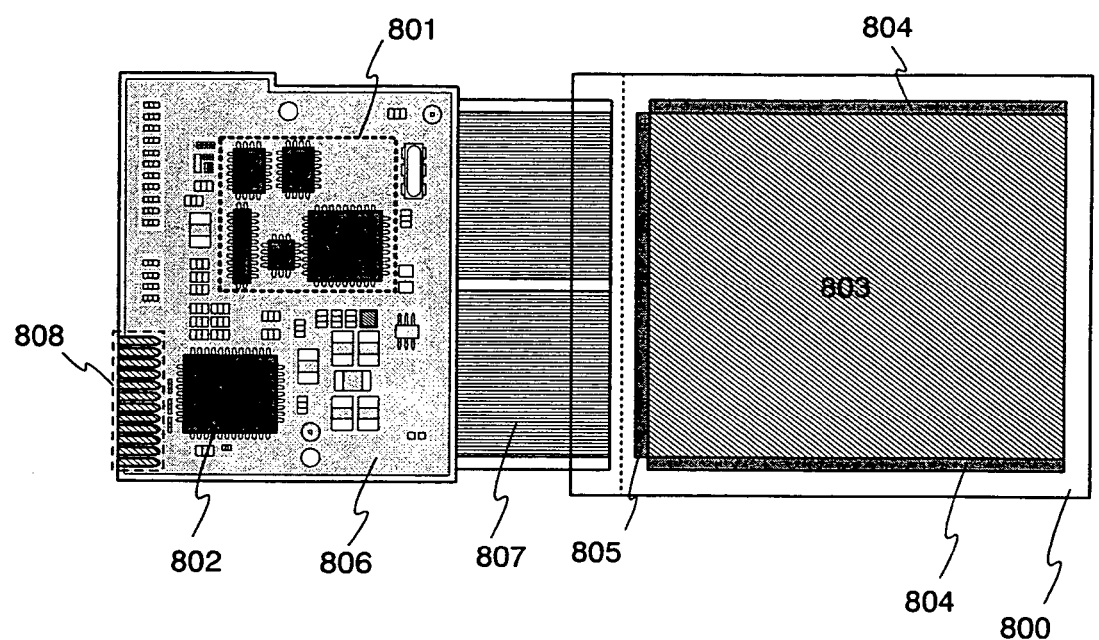
FIG. 7 is an outline view of the semiconductor display device of the invention.

FIG. 7 is an outline view of a light emitting device which is included in the semiconductor display devices of the invention. The semiconductor display device includes various modes in which the use of the invention is apparent, such as a component substrate which corresponds to one mode in which transistors for controlling the drive of display elements are formed in each of the pixels but display elements are not formed, a panel which corresponds to a mode in which display elements are formed on the component substrate, and a module which corresponds to a mode in which an IC including a controller, a power supply circuit and the like are implemented in the panel. In this embodiment, an example of a specific configuration of a light emitting device as a module is described.

FIG. 7 is an outline view of a module implemented with a controller 801 and a power supply circuit 802 in a panel 800. The panel 800 comprises a pixel portion 803 provided with a light emitting element in each of the pixels, a scan driver circuit 804 for selecting the pixels in the pixel portion 803, and a signal line driver circuit 805 for supplying video signals to the selected pixels. In FIG. 7, the source follower or the voltage follower of the invention is provided on the output side of the signal line driver circuit 805.

A printed substrate 806 comprises a controller 801 and a power supply circuit 802. Each type of signals and power supply voltage outputted from the controller 801 or the power supply circuit 802 are supplied to the pixel portion 803, the scan driver circuit 804, and the signal line driver circuit 805 in the panel 800 via an FPC 807. The video signals for controlling the drive of the source follower and the voltage follower are supplied to the signal line driver circuit from the controller 801. Each type of signals and power supply voltage to be supplied to the printed substrate 806 are supplied via an interface (I/F) portion 808 provided with a plurality of input terminals.

In this embodiment, the panel 800 is implemented with the printed substrate 806 via the FPC 807, however, the invention is not limited to this structure. The controller 801 and the power supply circuit 802 may be directly mounted on the panel 800 by using COG (Chip On Glass) method. The controller 801 and the power supply circuit 802 may be integrated in the panel 800 as well. Further, in the printed substrate 806, capacitance formed between the lead wirings and resistance of the wirings themselves and the like may cause a blunted rise of the signals or a noise in the power supply voltage or the signals. In order to solve the aforementioned problems, a variety of elements such as a capacitor, a buffer or the like may be provided on the printed substrate 806 to avoid the blunted rise of the signals or a noise in the power supply voltage or the signals.

EMBODIMENT 4

The semiconductor device of the invention can be applied to a variety of electronic devices, such as a video camera, a digital camera, a goggle display (a head mounted display), a navigation system, an audio reproduction device (a car audio, an audio component system and the like), a laptop computer, a game machine, a portable information terminal (a mobile computer, a cellular phone, a portable game machine or an electric book and the like), an image reproduction device provided with a recording medium (more specifically, a device which can reproduce a recording medium such as a DVD (digital versatile disc) and so forth, and includes a display for displaying the reproduced image), or the like. Specific examples of the electronic devices are shown in FIGS. 8A to 8H.

Figure 8A:
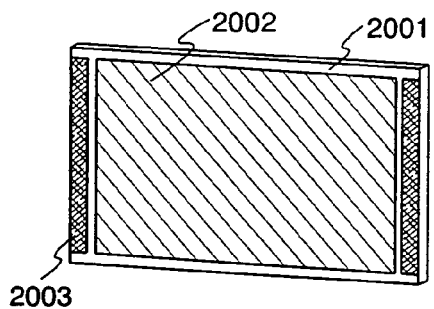
FIGS. 8A to 8H are examples of the electronic devices using the invention.

FIG. 8A illustrates a display device which includes a housing 2001, a display portion 2002, and a speaker portion 2003. The semiconductor device of the invention can be applied to the display portion 2002. The display device includes a whole series of display device for displaying information, such as a personal computer, a receiver of TV broadcasting and an advertising display. The semiconductor device of the invention can be applied to the display portion 2002 and the other signal processing circuit.

Figure 8B:
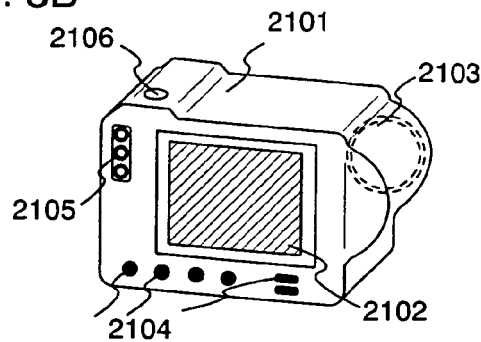

FIG. 8B illustrates a digital still camera which includes a body 2101, a display portion 2102, an image receiving portion 2103, an operation key 2104, an external connection port 2105, a shutter 2106 and the like. The semiconductor device of the invention can be applied to the display portion 2102 or the other signal processing circuit.

Figure 8C:
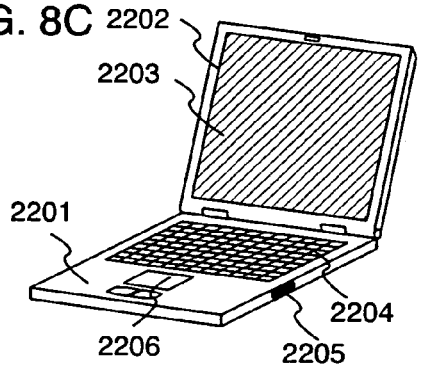

FIG. 8C illustrates a laptop computer which includes a body 2201, a housing 2202, a display portion 2203, a keyboard 2204, an external connection port 2205, a pointing mouse 2206 and the like. The semiconductor device of the invention can be applied to the display portion 2203 or the other signal processing circuit.

Figure 8D:
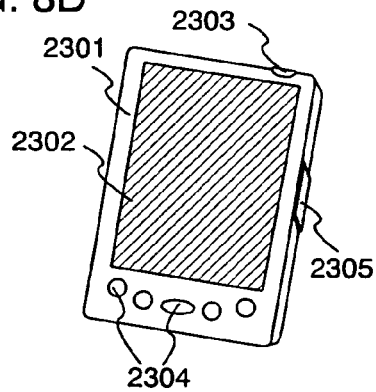

FIG. 8D illustrates a mobile computer which includes a body 2301, a display portion 2302, a switch 2303, an operation key 2304, an infrared port 2305 and the like. The semiconductor device of the invention can be applied to the display portion 2302 or the other signal processing circuit.

Figure 8E:
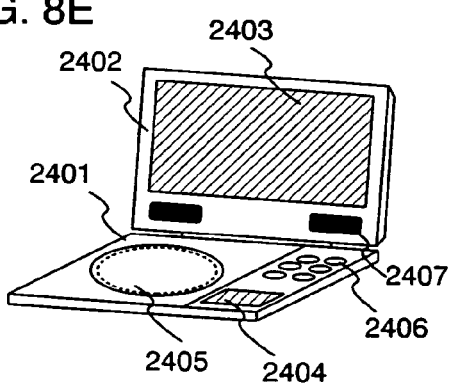

FIG. 8E illustrates a portable image reproduction device provided with a recording medium (specifically a DVD reproduction device), which includes a body 2401, a housing 2402, a display portion A 2403, a display portion B 2404, a recoding medium (DVD or the like) reading portion 2405, an operation key 2406, a speaker portion 2407 and the like. The display portion A 2403 mainly displays image data while the display portion B 2404 mainly displays text data. Note that the image reproduction device provided with a recording medium includes a domestic game machine and the like. The semiconductor device of the invention can be applied to the display portions A 2403 and B 2404 or the other signal processing circuit.

Figure 8F:
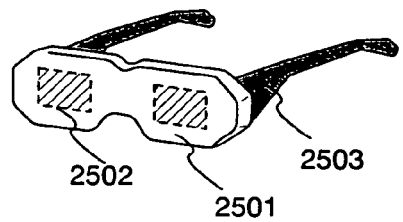

FIG. 8F illustrates a goggle type display (a head mounted display) which includes a body 2501, a display portion 2502, and an arm portion 2503. The semiconductor device of the invention can be applied to the display portion 2502 or the other signal processing circuit.

Figure 8G:
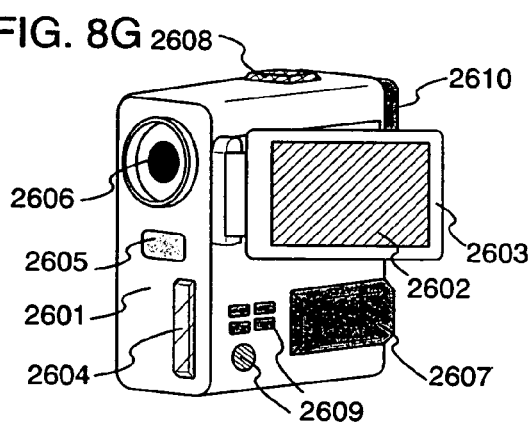

FIG. 8G illustrates a video camera which includes a body 2601, a display portion 2602, a housing 2603, an external connection port 2604, a remote control receiving portion 2605, an image receiving portion 2606, a battery 2607, an audio input portion 2608, operation keys 2609 and the like. The semiconductor device of the invention can be applied to the display portion 2602 or the other signal processing circuits.

Figure 8H:
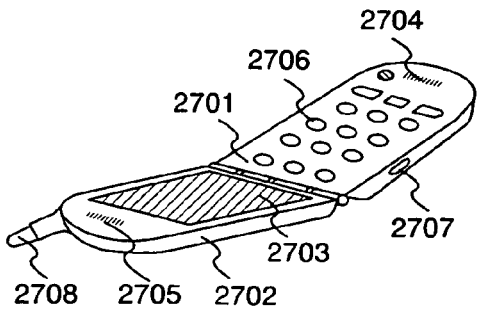
Figure 9A:
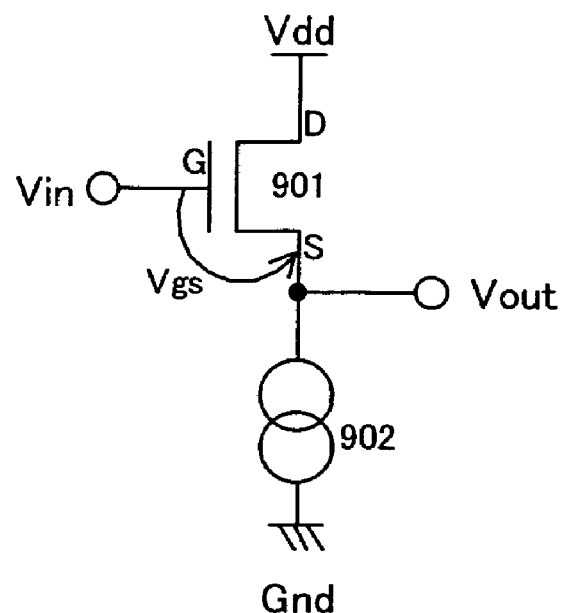
FIGS. 9A and 9B are the conventional source follower and the measured data of the input potential Vin and the output potential Vout.
Figure 9B:
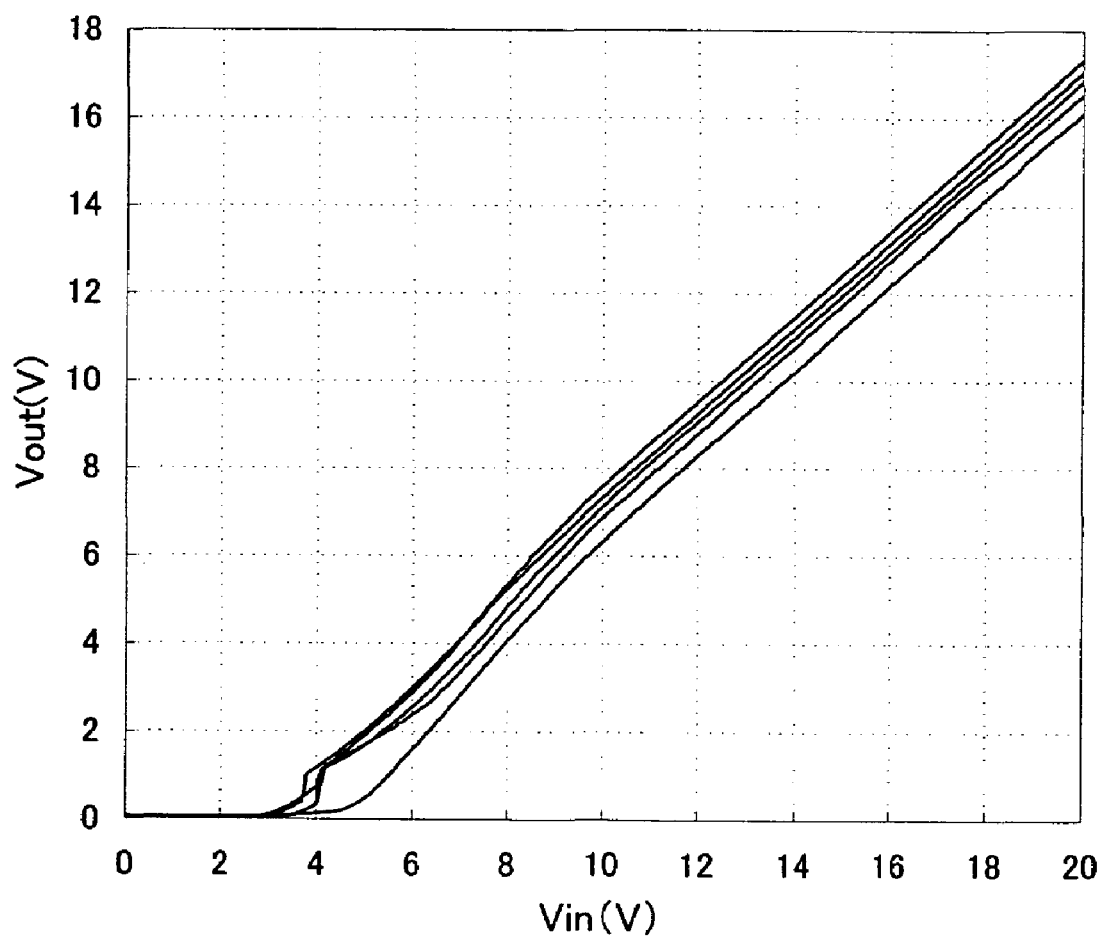

FIG. 8H illustrates a cellular phone which includes a body 2701, a housing 2702, a display portion 2703, an audio input portion 2704, an audio output portion 2705, an operation key 2706, an eternal connection port 2707, an antenna 2708 and the like. Note that the power consumption of the cellular phone can be reduced by displaying a white text on a black background in the display portion 2703. The semiconductor device of the invention can be applied to the display portion 2703 and the other signal processing circuits.

As described above, the applicable range of the invention is so wide that the invention can be applied to electronic devices of various fields.

What is claimed is:

1. A source follower comprising:
   a transistor;
   a capacitor comprising a first electrode and a second electrode;
   a constant current supply connected to a source of the transistor; and
   a plurality of switching elements which can select any one of first to third modes,
   wherein in the first mode, a first potential is supplied to a gate of the transistor and an input potential is supplied to the first electrode, respectively, and the second electrode and the source of the transistor are connected;
   wherein in the second mode, an input potential is supplied to the first electrode, and the gate of the transistor and a potential of the second electrode floats, and
   wherein in the third mode, the first electrode and the gate of the transistor are connected, and a potential thereof floats and a second potential is supplied to the second electrode.

2. The source follower according to claim 1, wherein the plurality of switching elements are provided five or more.

3. A semiconductor device comprising the source follower according to claim 1,
   wherein the semiconductor device comprises a pixel provided with a display element,
   wherein a potential of a video signal is supplied to the source follower as the input potential, and
   wherein the output potential of the source follower is supplied to the pixel via a signal line.

4. A semiconductor device comprising the source follower according to claim 1, and a first analog latch and a second analog latch in a signal line driver circuit,
   wherein the semiconductor device comprises a pixel provided with a display element,
   wherein a potential of a video signal inputted to the first analog latch sequentially is supplied to the source follower as the input potential after supplied to the second latch, and
   wherein the output potential of the source follower is supplied to the pixel via a signal line.

5. A semiconductor device comprising the source follower according to claim 1, and an analog latch in a signal line driver circuit,
   wherein the semiconductor device comprises a pixel provided with a display element,
   wherein a potential of a video signal inputted to the analog latch sequentially is supplied to the source follower as the input potential, and
   wherein the output potential of the source follower is supplied to the pixel via a signal line.

6. A source follower according to claim 1, wherein the source follower is incorporated in at least one selected from the group consisting of a display device, a digital camera, a laptop computer, a mobile computer, an image reproduction device, a goggle type display, a video camera, and a cellular phone.

7. A source follower comprising:
   a transistor;
   a capacitor comprising a first electrode and a second electrode;
   a first switching element for controlling a supply of an input potential to the first electrode;

a second switching element for controlling a supply of a first potential to a gate of the transistor;

a third switching element for controlling a connection between the gate of the transistor and the first electrode;

a fourth switching element for controlling a supply of a second potential to the second electrode;

a fifth switching element for controlling a connection between the second electrode and a source of the transistor; and a constant current supply connected to the source of the transistor, wherein the second and third switching elements control a supply of the first potential to the first electrode.

8. A semiconductor device comprising the source follower according to claim 7, wherein the semiconductor device comprises a pixel provided with a display element, wherein a potential of a video signal is supplied to the source follower as the input potential, and wherein the output potential of the source follower is supplied to the pixel via a signal line.

9. A semiconductor device comprising the source follower according to claim 7, and a first analog latch and a second analog latch in a signal line driver circuit, wherein the semiconductor device comprises a pixel provided with a display element, wherein a potential of a video signal inputted to the first analog latch sequentially is supplied to the source follower as the input potential after supplied to the second latch, and wherein the output potential of the source follower is supplied to the pixel via a signal line.

10. A semiconductor device comprising the source follower according to claim 7, and an analog latch in a signal line driver circuit, wherein the semiconductor device comprises a pixel provided with a display element, wherein a potential of a video signal inputted to the analog latch sequentially is supplied to the source follower as the input potential, and wherein the output potential of the source follower is supplied to the pixel via a signal line.

11. A source follower according to claim 7, wherein the source follower is incorporated in at least one selected from the group consisting of a display device, a digital camera, a laptop computer, a mobile computer, an image reproduction device, a goggle type display, a video camera, and a cellular phone.

12. A voltage follower comprising:

an operational amplifier;

a capacitor comprising a first electrode and a second electrode; and a plurality of switching elements which can select any one of first to third modes, wherein in the first mode, a first potential is supplied to a non-inverted input terminal of the operational amplifier and an input potential is supplied to the first electrode respectively and the second electrode and an output terminal of the operational amplifier are connected, wherein in the second mode, an input potential is supplied to the first electrode and the non-inverted input terminal and the second electrode floats, and wherein in the third mode, the first electrode and the non-inverted input terminal are connected and a potential thereof floats and a second potential is supplied to the second electrode.

13. The voltage follower according to claim 12, wherein the plurality of switching elements are provided five or more.

14. A semiconductor device comprising the voltage follower according to claim 12, wherein the semiconductor device comprises a pixel provided with a display element, wherein a potential of a video signal is supplied to the voltage follower as the input potential, and wherein the output potential of the voltage follower is supplied to the pixel via a signal line.

15. A semiconductor device comprising the voltage follower according to claim 12, and a first analog latch and a second analog latch in a signal line driver circuit, wherein the semiconductor device comprises a pixel provided with a display element, wherein a potential of a video signal inputted to the first analog latch sequentially is supplied to the voltage follower as the input potential after supplied to the second analog latch, and wherein the output potential of the voltage follower is supplied to the pixel via a signal line.

16. A semiconductor device comprising the voltage follower according to claim 12, and an analog latch in a signal line driver circuit, wherein the semiconductor device comprises a pixel provided with a display element, wherein a potential of a video signal inputted to the analog latch sequentially is supplied to the voltage follower as the input potential, and wherein the output potential of the voltage follower is supplied to the pixel via a signal line.

17. A voltage follower according to claim 12, wherein the source follower is incorporated in at least one selected from the group consisting of a display device, a digital camera, a laptop computer, a mobile computer, an image reproduction device, a goggle type display, a video camera, and a cellular phone.

18. A voltage follower comprising:

an operational amplifier;

a capacitor comprising a first electrode and a second electrode;

a first switching element for controlling a supply of an input potential to the first electrode;

a second switching element for controlling a supply of a first potential to a non-inverted input terminal of the operational amplifier;

a third switching element for controlling a connection between the non-inverted input terminal and the first electrode;

a fourth switching element for controlling a supply of a second potential to the second electrode; and a fifth switching element for controlling a connection between the second electrode and an output terminal of the operational amplifier, wherein the second and third switching elements control a supply of the first potential to the first electrode; and an inverted input terminal of the operational amplifier is connected to the output terminal thereof.

19. A semiconductor device comprising the voltage follower according to claim 18, wherein the semiconductor device comprises a pixel provided with a display element, wherein a potential of a video signal is supplied to the voltage follower as the input potential, and wherein the output potential of the voltage follower is supplied to the pixel via a signal line.

20. A semiconductor device comprising the voltage follower according to claim 18, and a first analog latch and a second analog latch in a signal line driver circuit,
wherein the semiconductor device comprises a pixel provided with a display element,
wherein a potential of a video signal inputted to the first analog latch sequentially is supplied to the voltage follower as the input potential after supplied to the second analog latch, and
wherein the output potential of the voltage follower is supplied to the pixel via a signal line.

21. A semiconductor device comprising the voltage follower according to claim 18, and an analog latch in a signal line driver circuit,
wherein the semiconductor device comprises a pixel provided with a display element,
wherein a potential of a video signal inputted to the analog latch sequentially is supplied to the voltage follower as the input potential, and
wherein the output potential of the voltage follower is supplied to the pixel via a signal line.

22. A voltage follower according to claim 18, wherein the source follower is incorporated in at least one selected from the group consisting of a display device, a digital camera, a laptop computer, a mobile computer, an image reproduction device, a goggle type display, a video camera, and a cellular phone.

23. A semiconductor device comprising:
a transistor;
a capacitor comprising a first electrode and a second electrode;
a constant current supply connected to a source of the transistor; and
a plurality of switching elements which can select any one of first to third modes,
wherein in the first mode, a first potential is supplied to a gate of the transistor and an input potential is supplied to the first electrode respectively and the second electrode and a source of the transistor are connected,
wherein in the second mode, an input potential is supplied to the first electrode and the gate of the transistor and a potential of the second electrode floats, and
wherein in the third mode, the first electrode and the transistor are connected and a potential thereof floats and a second potential is supplied to the second electrode.

24. The semiconductor device according to claim 23, wherein the plurality of switching elements are provided five or more.

25. A semiconductor device according to claim 23, wherein the semiconductor device is at least one selected from the group consisting of a display device, a digital camera, a laptop computer, a mobile computer, an image reproduction device, a goggle type display, a video camera, and a cellular phone.

26. A semiconductor device comprising:
a transistor;
a capacitor comprising a first electrode and a second electrode;
a first switching element for controlling a supply of an input potential to the first electrode;
a second switching element for controlling a supply of a first potential to a gate of the transistor;
a third switching element for controlling a connection between the gate of the transistor and the first electrode;
a fourth switching element for controlling a supply of a second potential to the second electrode;
a fifth switching element for controlling a connection between the second electrode and a source of the transistor; and
a constant current supply connected to the source of the transistor,
wherein the second and third switching elements control a supply of the first potential to the first electrode.

27. A semiconductor device according to claim 26, wherein the semiconductor device is at least one selected from the group consisting of a display device, a digital camera, a laptop computer, a mobile computer, an image reproduction device, a goggle type display, a video camera, and a cellular phone.

* * * * *